(12) United States Patent
Weaver et al.

(10) Patent No.: US 9,412,947 B2
(45) Date of Patent: Aug. 9, 2016

(54) OLED FABRICATION USING LASER TRANSFER

(75) Inventors: Michael Stuart Weaver, Princeton, NJ (US); Michael Hack, Princeton, NJ (US); Julia J. Brown, Yardley, NJ (US)

(73) Assignee: Universal Display Corporation, Ewing, NJ (US)

( * ) Notice: Subject to any disclaimer, the term of this patent is extended or adjusted under 35 U.S.C. 154(b) by 865 days.

(21) Appl. No.: 13/618,445

(22) Filed: Sep. 14, 2012

(65) Prior Publication Data

US 2014/0077164 A1    Mar. 20, 2014

(51) Int. Cl.
*H01L 51/50* (2006.01)
*H01L 51/00* (2006.01)

(52) U.S. Cl.
CPC .......... *H01L 51/0013* (2013.01); *H01L 51/504* (2013.01)

(58) Field of Classification Search
CPC .................................................. B41M 5/38214
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 7,968,146 B2 | 6/2011 | Wagner et al. | |
| 7,968,214 B2* | 6/2011 | Noh et al. | 428/690 |
| 2003/0230980 A1 | 12/2003 | Forrest et al. | |
| 2004/0174116 A1 | 9/2004 | Lu et al. | |
| 2005/0253506 A1* | 11/2005 | Tsai et al. | 313/506 |
| 2010/0055343 A1* | 3/2010 | Lee et al. | 427/554 |
| 2012/0319145 A1 | 12/2012 | Weaver et al. | |

FOREIGN PATENT DOCUMENTS

WO    2008057394    5/2008
WO    2010011390    1/2010

OTHER PUBLICATIONS

Baldo et al.,"Highly efficient phosphorescent emission from organic electroluminescent devices", Nature, vol. 395, pp. 151-154, 1998.

(Continued)

*Primary Examiner* — Nathan T Leong
(74) *Attorney, Agent, or Firm* — Morris & Kamlay LLP

(57) ABSTRACT

Techniques for fabricating organic light emitting devices, and devices fabricating using the disclosed techniques, are provided. In the disclosed techniques, a layer including an emissive material and a buffer material may be deposited in a single laser transfer process, such as a laser-induced thermal imaging process. The emissive and buffer materials may be deposited in discrete layers during the transfer process. Examples of buffer materials as disclosed include blocking materials, transfer materials, and the like. Additional layers may be deposited using conventional techniques or additional laser transfer processes.

16 Claims, 5 Drawing Sheets

(56) References Cited

OTHER PUBLICATIONS

Baldo et al., "Very high-efficiency green organic light-emitting devices based on electrophosphorescence", Applied Physics Letter, vol. 75, No. 1, pp. 4-6, 1999.

Lee, Seong Taek et al., "A New Patterning Method for Full-Color Polymer Light-Emitting Devices: Laser Induced Thermal Imaging (LITI)", Proceedings of the Society for Information Display, Digest of Technical Papers 33: (suppl2):784-787, 2002.

Lee, Seong Taek et al., "A Novel Patterning Method for Full-Color Organic Light-Emitting Devices: Laser Induced Thermal Imaging (LITI)", Proceedings of the Society for Information Display, Digest of Technical Papers 35: (suppl2):1006-1011, 2004.

Yamamoto, Hitoshi et al., "Identification of device degradation positions in multi-layered phosphorescent organic light emitting devices using water probes", Appl. Phys. Lett, 100, 183306, 2012.

\* cited by examiner

OLED FABRICATION USING LASER TRANSFER

The claimed invention was made by, on behalf of and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light emitting devices and, more specifically, to fabrication using laser transfer techniques of devices such as OLEDs.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)$_3$, which has the following structure:

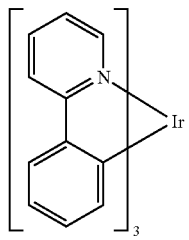

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Techniques for fabricating light emitting devices using laser transfer are provided. In an embodiment, a first layer may be deposited over a substrate, and a second layer deposited over the first layer using a laser transfer process. The second layer may comprise multiple materials and/or layers, such as one or more emissive materials and/or one or more buffer materials. The second layer also may include multiple emissive materials, which may have the same or different emission spectra or peak emission wavelengths. One or more additional layers may be deposited over the second layer. The buffer material may include, for example, a blocking material, a transport material or both. One or more additional buffer materials may be deposited below the emissive material, which may include the same or different materials as the first buffer material. Additional layers and materials may be deposited over the initial three layers via various processes, such as a laser transfer process. The various layers and materials deposited, including the emissive materials, may include organic emissive materials. Devices fabricated according to the disclosed techniques are also provided. Example devices that may be fabricated include a full-color display, a flexible display, a portable device, a tablet device, a smart phone, an illumination device, a wireless handheld device, a television, and a consumer device having a flexible display, and combinations thereof.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
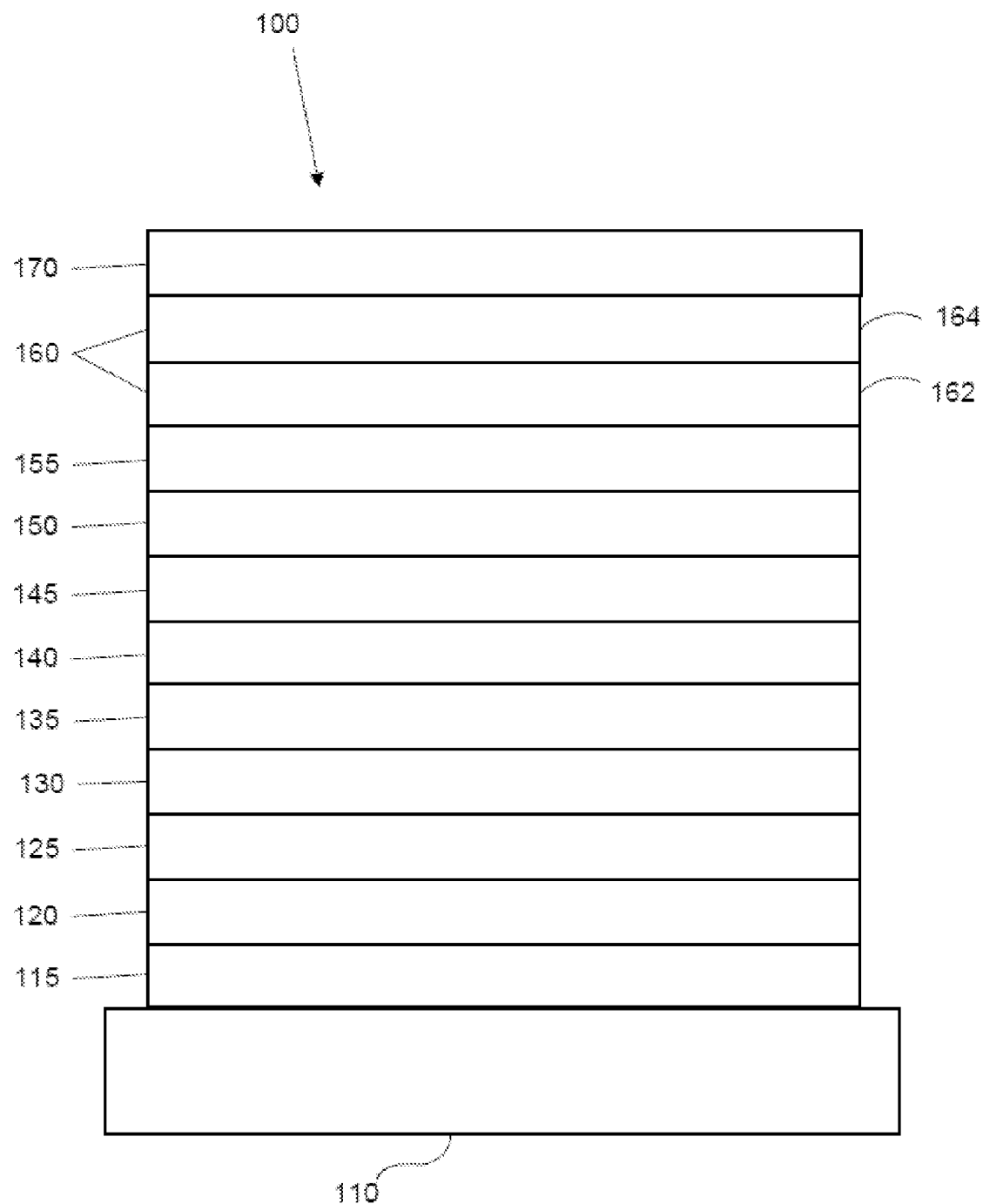
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
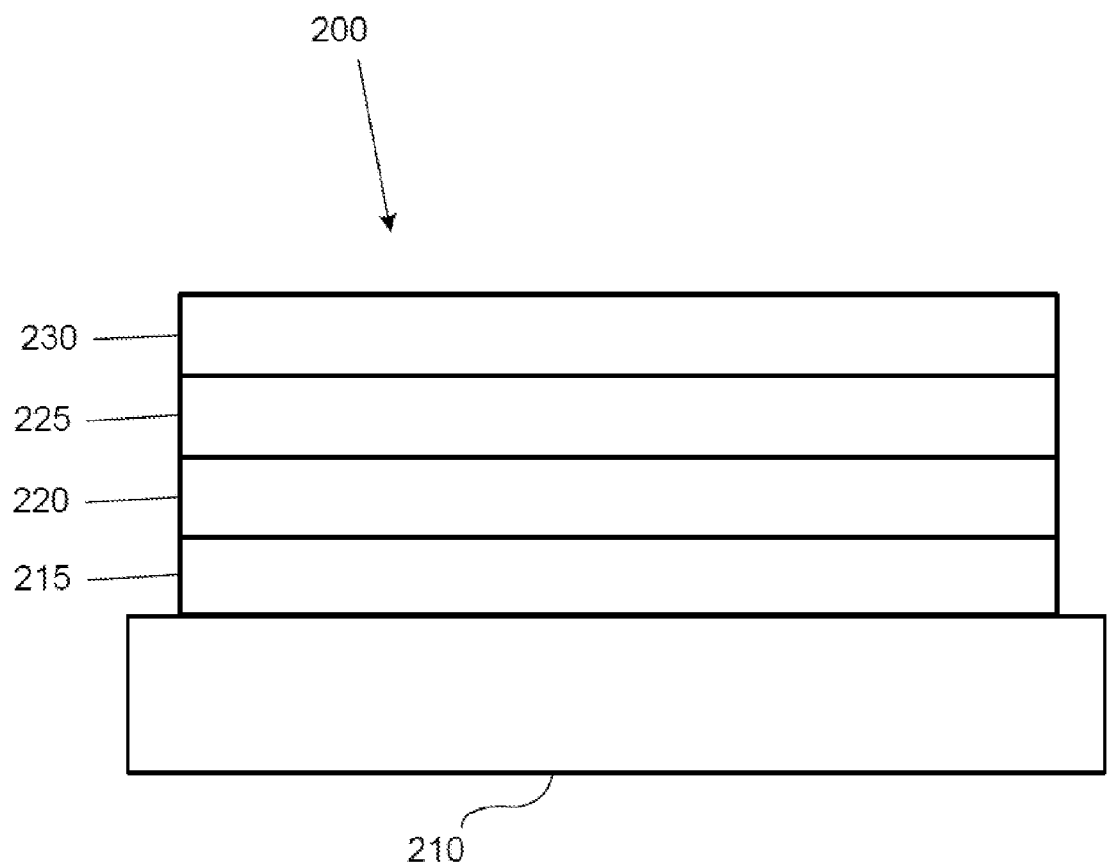
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As previously described, various techniques such as OVPD, OVJP, vapor thermal evaporation (VTE), ink jet printing, deposition through a mask, solution processing, cold welding, and the like, may be used to fabricate one or more layers in a light emitting device. In an embodiment of the present invention, a laser transfer technique may be used to deposit one or more materials or layers of a device. One such process is laser thermal transfer. Laser thermal transfer makes use of a donor film coated with a light-to-heat conversion layer. The conversion layer may be coated with one or more organic layers or other layers that are components of the device being fabricated. The layer is placed in contact with the substrate and the donor film is scanned with a laser in an intended deposition pattern, which causes the organic layer and/or other layers to be deposited on the substrate.

The donor film used in a laser transfer process typically includes a transparent, flexible material, such as a polyester. The conversion film is chosen to absorb the laser light, typically in the IR region of the spectrum, and convert this light to heat. One or more coatings, such as carbon coatings, may be applied to the film. As the laser is applied to the layer, the light is converted to heat and the material is transferred from the conversion film to the substrate. Typically the deposited materials are chosen to have desired mechanical properties, such as a relatively weak cohesion and an appropriate balance of adhesive forces between the donor film and the deposited film, as will be readily understood by one of skill in the art. Further, it is desirable that the films are able to withstand the heat generated by application of the laser to prevent degradation of the deposited material(s).

The desired mechanical and thermal properties of the films may not be required for a given material if only the electrical and optical properties which make it suitable for use in a device, such as an OLED, are considered. In some cases it may be more desirable to deposit emissive layers using laser transfer, since other transport layers may be deposited with a wider-opening and/or less accurately positioned mask. Thus, it may be desirable to deposit only the emissive layers of a device using laser transfer.

However, laser transfer processes such as laser thermal transfer are often performed in a non-high vacuum environment, which may result in appreciable amounts of water or other undesirable substances forming at the interface to which the laser transfer layer is deposited, and/or on the upper surface of the laser transfer layer once deposited, prior to the deposition of a subsequent layer. For example, in a conventional laser thermal transfer process these 2 interfaces are the most susceptible to degradation and often may limit the device lifetime.

To reduce or eliminate the formation or condensation of undesirable materials, in embodiments of the present invention one or more emissive layers (EMLs) may be deposited via laser transfer with a "buffer" layer, such as a transport and/or blocker layer material. The buffer material may be disposed on one or both sides of the EML as part of the stack of materials deposited in the laser transfer process. The buffer material(s) typically may be less susceptible to damage or degradation from condensation or other potentially undesirable effects of the laser transfer process. Further, the use of a buffer layer as disclosed herein also prevent undesirable material from coming in contact with or close proximity to the emissive layer, thus preventing or reducing undesirable decrease to the performance of the emissive layer. Thus, the resulting layer or layers may be suitable for use in a light emitting device such as an OLED without significant degradation or other undesirable impact on device performance.

For example, in an embodiment of the invention, a light-emitting device may be fabricated by depositing a first layer, such as a cathode, anode, transport layer, or other layer, over a substrate. The first layer may be deposited using any suitable technique, such as VTE, solution processing, inkjet printing, or the like. A second layer may then be deposited over the first layer via a laser transfer process such as laser thermal transfer. The second layer may include multiple layers or sub-layers, such as an emissive material and a buffer material. The buffer material may be any layer suitable to be disposed adjacent to the emissive material, such as a transport material, blocking material, or the like. One or more additional layers, such as a cathode, anode, transport layer, or other layer may be deposited over the emissive and buffer layers using any suitable technique.

Figure 3A:
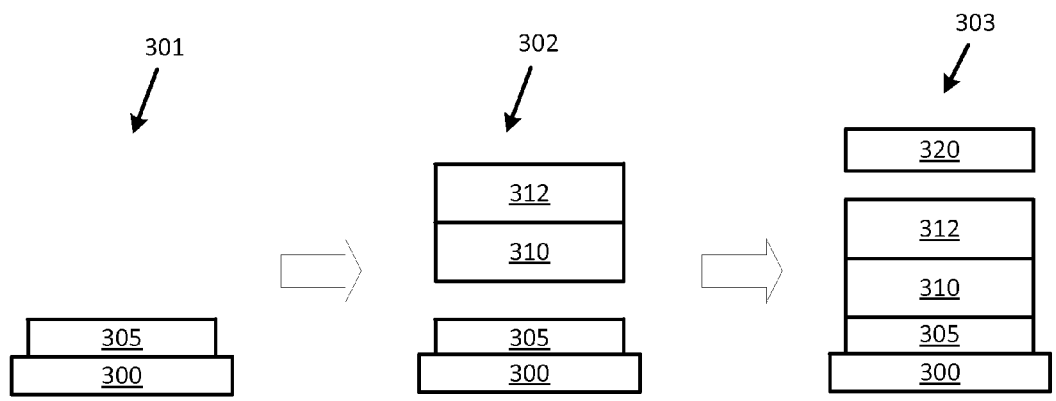
FIG. 3A shows an example process for fabricating a light-emitting device and resulting device structure according to an embodiment of the disclosed invention.

FIG. 3A shows an example process for fabricating a light-emitting device and resulting device structure according to an embodiment disclosed herein. At 301, a first layer 305 may be deposited over a substrate 300. The first layer 305 may be, for example, an injection layer, transport layer, other non-emissive layer, or the like, and may be deposited using any suitable technique, for example OVPD, OVJP, VTE, ink jet printing, deposition through a mask, solution processing, or cold welding. Other layers may be deposited before or after the first layer 305 using the same or different processes as used to deposit the first layer 305. At 302, a layer including an emissive material 310 and a buffer material 312 may be deposited using a laser transfer process, such as laser thermal transfer. Preferably the materials 310, 312 are deposited using a single laser transfer process, such that they are deposited as a stack of layers over the first layer 305. The buffer material may be any material suitable to be disposed adjacent to the emissive layer in a device, such as a transport layer, a blocking layer, an emissive layer, or the like. Upon deposition over the substrate, an emissive layer 310 and a layer of the buffer material 312 may be formed.

Figure 3B:
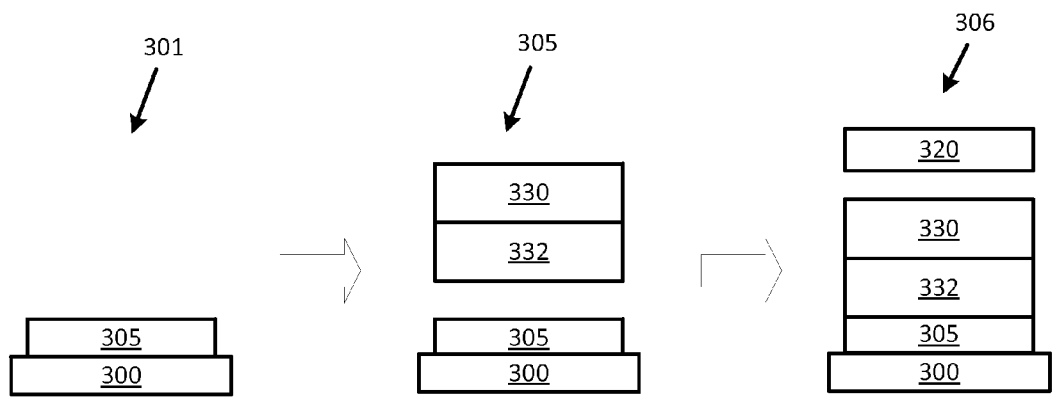
FIG. 3B shows an example process for fabricating a light-emitting device and resulting device structure according to an embodiment of the disclosed invention.

FIG. 3B shows another example process for fabricating a light-emitting device and resulting device structure according to an embodiment disclosed herein. As disclosed with respect to FIG. 3A, at 301, a first layer 305 may be deposited over a substrate 300. The first layer 305 may be, for example, an injection layer, transport layer, other non-emissive layer, or the like, and may be deposited using any suitable technique, for example OVPD, OVJP, VTE, ink jet printing, deposition through a mask, solution processing, or cold welding. Other layers may be deposited before or after the first layer 305 using the same or different processes as used to deposit the first layer 305. At 305, a layer including an emissive material 330 and a buffer material 332 may be deposited using a laser transfer process, such as laser thermal transfer. Preferably the materials 330, 332 are deposited using a single laser transfer process, such that they are deposited as a stack of layers over the first layer 305. The buffer material may be any material suitable to be disposed adjacent to the emissive layer in a device, such as a transport layer, a blocking layer, an emissive layer, or the like. Upon deposition over the substrate, an emissive layer 330 and a layer of the buffer material 332 may be formed. Some or all of the specific materials and layers used in the process shown in FIG. 3B may be the same as those in FIG. 3A, or they may be different.

More generally, more materials may be deposited during the laser transfer process to form additional layers in the resulting device. For example, multiple emissive materials may be used, which may result in multiple emissive layers, or a single emissive layer that includes multiple emissive materials. As another example, one or more additional buffer materials may be used, such that a layer of buffer material is formed above, below, or both above and below the emissive layer 310. In configurations where a layer of buffer material is formed both above and below the emissive layer, the resulting layers of buffer material may include the same materials or different materials, and may operate the same or differently within the resulting device. The buffer material 312 also may include additional emissive materials, which may form an emissive layer or become part of the emissive layer 310 in the resulting device. For example, the buffer material 312 may include an emissive material that is less susceptible to degradation or damage during a laser transfer process than the emissive material 310.

At 303, one or more third additional layers 320 may be deposited over the emissive material 310 and the buffer material 312 to form a completed device. The additional layers 320 may include, for example, a cathode, an anode, a transport layer, a blocking layer, or combinations thereof, and may be constructed by any suitable technique, for example OVPD, OVJP, VTE, ink jet printing, deposition through a mask, solution processing, or cold welding.

Figure 4:
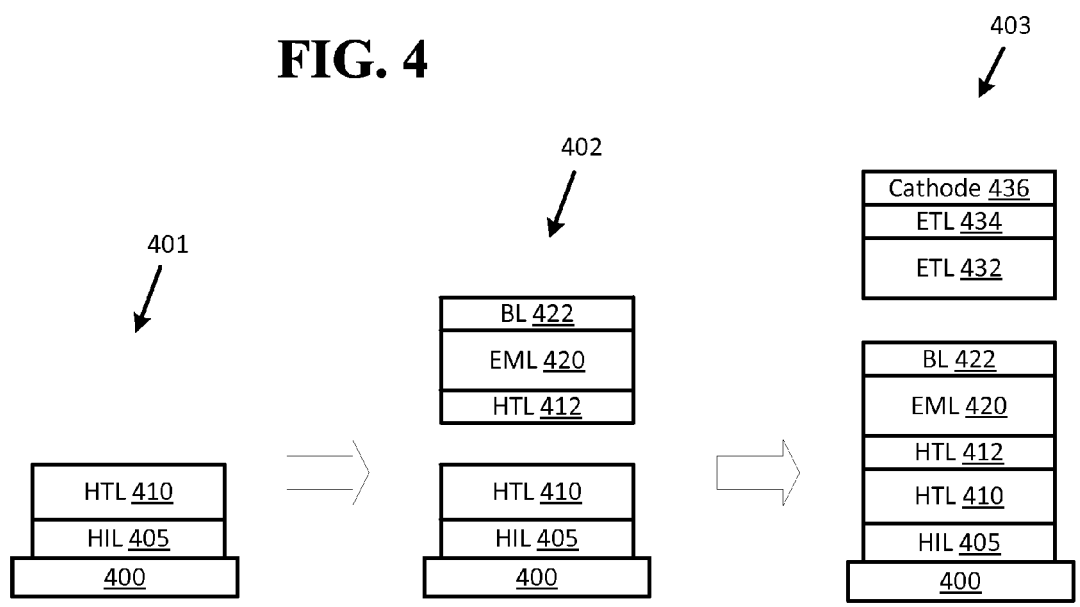
FIG. 4 shows an example process for fabricating a light-emitting device and resulting device structure according to an embodiment of the disclosed invention.

It may be preferable to fabricate multiple materials in a single laser transfer process, such as to deposit a stack of different layers in a device. FIG. 4 shows an example of depositing multiple materials and/or layers via a laser transfer process according to an embodiment of the invention. At 401, one or more layers 405, 410 may be fabricated on a substrate 400. The layers may include, for example, a hole injection layer 405 and a hole transport layer 410, and may be deposited using any suitable technique, such as solution processing or VTE. The layers may be fabricated individually, or may be fabricated in a single or combined process. At 402, a stack including an emissive material and one or more buffer materials may be fabricated above the HTL 410 using a single laser transfer process as previously described, to form a blocking layer 422, emissive layer 420, and hole transport layer 412. In this example, the blocking layer material and the hole transport layer material may serve as buffer materials to the emissive layer material, and may prevent damage or other undesirable effects to the emissive material during the laser transfer process. As illustrated in FIG. 4, one or more buffer materials may include the same material, or perform the same function as a previously-fabricated layer. For example, a hole transport buffer material in the hole transport layer 412 may be the same as a material in the previously-fabricated hole transport layer 410. Thus, although shown as separate layers for the purposes of illustration, the two HTLs 410, 412 may form or operate as a single layer after completion of the laser transfer process and/or in the finished device.

At 403, additional layers may be fabricated over the layers fabricated during the laser transfer process of 402. For example, a cathode 436, transport layer 432, and electron injection layer 434 may be deposited using any suitable technique, such as VTE. The finished device may then include the layers 405, 410, 412, 420, 422, 432, 434, and 436 as shown. Other layers and types of layers also may be fabricated over those deposited during the laser transfer process of 402.

Figure 5:
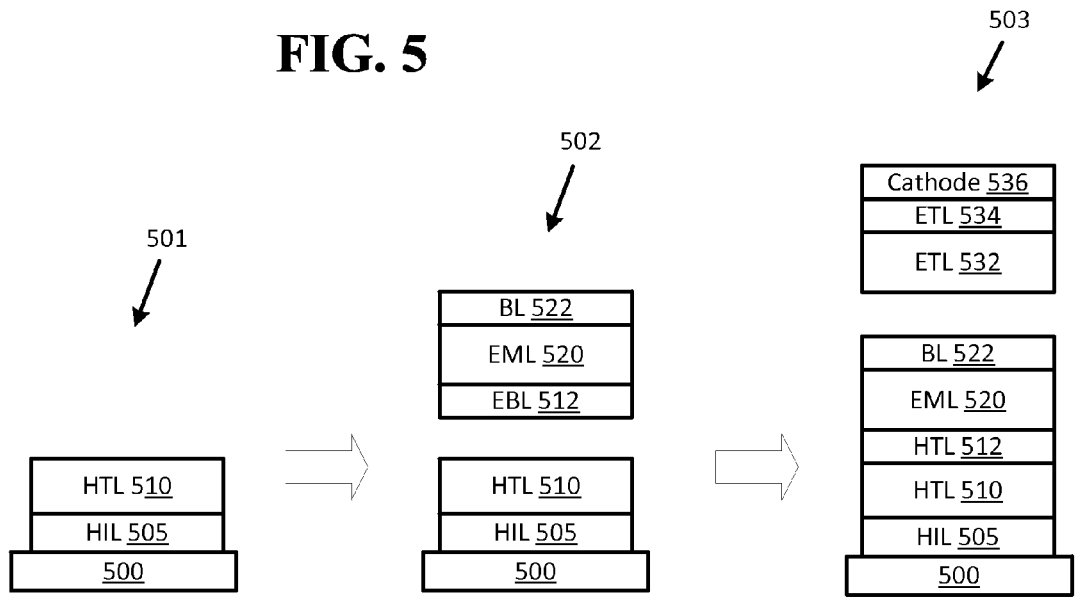
FIG. 5 shows an example process for fabricating a light-emitting device and resulting device structure according to an embodiment of the disclosed invention.

FIG. 5 shows another example process for fabricating a light-emitting device and resulting device structure according to an embodiment of the invention. At 501, one or more layers 505, 510 may be fabricated on a substrate 500. The layers may include, for example, a hole injection layer 505 and a hole transport layer 510, and may be deposited using any suitable technique, such as solution processing or VTE. The layers may be fabricated individually, or may be fabricated in a single or combined process. At 502, a stack including an emissive material and one or more buffer materials may be fabricated above the HTL 510 using a single laser transfer process as previously described, to form a blocking layer 522, an emissive layer 520, and an electron blocking layer 512. In this example, the blocking layer material and the electron blocking layer material may serve as buffer materials to the emissive layer material, and may prevent damage or other undesirable effects to the emissive material during the laser transfer process. As previously described, a material deposited in the laser transfer process may form a single layer with a previously-fabricated layer and/or may serve the same purpose as a previously fabricated layer. For example, the En 632 and the En material 622 deposited during the laser transfer process may form or operate as a single layer in the completed device. At 603, additional layers may be fabricated over the layers fabricated during the laser transfer process of 602. For example, a cathode 636 and one or more transport layers 532, 534 may be deposited using any suitable technique, such as VTE. The finished device may then include the layers 505, 510, 512, 520, 522, 532, 534, and 536 as shown.

Figure 6:
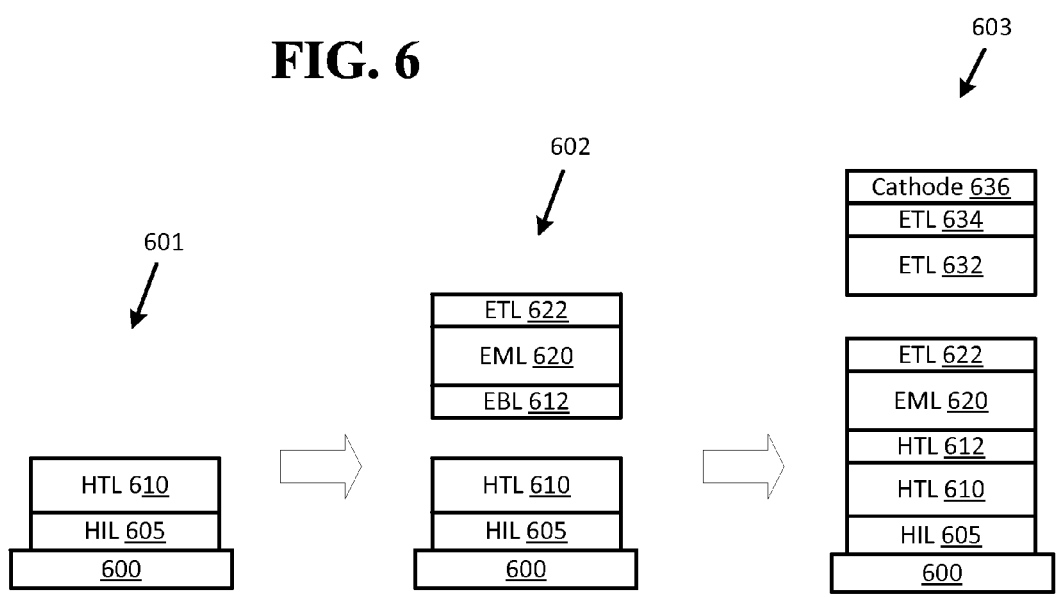
FIG. 6 shows an example process for fabricating a light emitting device and resulting device structure according to an embodiment of the disclosed invention.

FIG. 6 shows another example process for fabricating a light-emitting device and resulting device structure according to an embodiment of the invention. At 601, one or more layers 605, 610 may be fabricated on a substrate 600. The layers may include, for example, a hole injection layer 605 and a hole transport layer 610, and may be deposited using any suitable technique, such as solution processing or VTE. The layers may be fabricated individually, or may be fabricated in a single or combined process. At 602, a stack including an emissive material and one or more buffer materials may be fabricated above the HTL 610 using a single laser transfer process as previously described, to form an electron transport layer 622, an emissive layer 620, and an electron blocking layer 612. In this example, the electron transport material and the electron blocking layer material may serve as buffer materials to the emissive layer material, and may prevent damage or other undesirable effects to the emissive material during the laser transfer process. At 603, additional layers may be fabricated over the layers fabricated during the laser transfer process of 602. For example, a cathode 636 and one or more transport layers 632, 634 may be deposited using any suitable technique, such as VTE. The finished device may then include the layers 605, 610, 612, 620, 622, 632, 634, and 636 as shown.

The specific example described herein, such as with respect to FIGS. 4-6, are provided for illustration purposes only. The specific layers illustrated in each example are not intended to be limiting, and various other layers and material types may be used. Similarly, more than two buffer materials may be used in the laser transfer processes 402, 502, 602. Other layers may be fabricated using other processes, such as before, during, or after the non-laser transfer processes 401, 501, 601, 403, 503, 603.

It will be understood that although examples provided herein have been described with respect to fabrication of a single device, similar or identical processes may be used to fabricate multiple devices, for example to fabricate multiple pixels or sub-pixels in a display or similar device. To do so, the example processes described may be performed simultaneously over multiple regions of a substrate. The fabrication techniques disclosed herein may be used to fabricate a variety of devices including, but not limited to, a full-color display, a flexible display, a portable device, a tablet device, a smart phone, an illumination device, a wireless handheld device, a television, and a consumer device having a flexible display, and combinations thereof.

Techniques as disclosed herein may decrease degradation of the emissive and/or other layers of the device, and thereby improve device lifetime. More specifically, it is believed that the disclosed techniques may improve the LT97 device lifetime by 5 to more than 100 times relative to a device in which only the EML is deposited via a laser transfer technique, and/or a device in which the EML is deposited via a laser transfer technique and additional layers are separately deposited via a laser transfer technique, such as a device where the EML, HBL, ETL, and so on are each deposited via laser transfer over an anode on the substrate.

Although described with respect to laser thermal transfer, it will be understood that other similar laser transfer processes may be used without departing from the scope of the present disclosure and claims. For example, direct laser transfer processes also may be used, in which material being deposited does not adhere to the target during the transfer process, but is evaporated off the transfer substrate by the laser. The material is then deposited onto the target substrate and/or other materials.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method comprising:
   depositing a first layer over a substrate;
   depositing a second layer over the first layer via a laser transfer process, the second layer comprising a first emissive material and a first buffer material, the first emissive material forming a layer having a first side and a second side that is opposite to the first side, wherein the first buffer material is disposed on the first side of the first emissive material for application to the first layer, and no buffer material is disposed on the second side of the first emissive material during the laser transfer process to fabricate a light emitting device; and
   depositing a third layer over the second layer of the light emitting device.

2. A method as recited in claim 1, wherein the first buffer material comprises a blocking material.

3. A method as recited in claim 1, wherein the first buffer material comprises a transport material.

4. A method as recited in claim 1, wherein, after being deposited over the substrate, the emissive material is disposed in a layer over the buffer material.

5. A method as recited in claim 1, wherein the second layer further comprises a second buffer material.

6. A method as recited in claim 1, wherein the second layer further comprises a second emissive material.

7. A method as recited in claim 1, wherein the second layer comprises a plurality of emissive materials, each of the plurality of emissive materials having a different peak emission wavelength.

8. A method as recited in claim 1, further comprising depositing a fourth layer over the first layer in a second single laser thermal transfer process, the second layer comprising a second emissive material.

9. A method as recited in claim 8, wherein the fourth layer comprises a second buffer material.

10. A method as recited in claim 1, wherein the first emissive material comprises an organic emissive material.

11. A method as recited in claim 1, wherein the first buffer material comprises an organic material.

12. A method as recited in claim 1, wherein the step of depositing the first layer comprises depositing the first layer by vacuum thermal evaporation.

13. A method as recited in claim 1, wherein the step of depositing the third layer comprises depositing the third layer by vacuum thermal evaporation.

14. A method as recited in claim 1, wherein the first layer comprises a transport layer.

15. A method as recited in claim 1, wherein the third layer comprises a transport layer.

16. A method as recited in claim 1, wherein the third layer comprises an electrode.

* * * * *